United States Patent
Shih et al.

(10) Patent No.: US 10,128,212 B2
(45) Date of Patent: Nov. 13, 2018

(54) SEMICONDUCTOR PACKAGE AND FABRICATION METHOD THEREOF

(71) Applicant: Micron Technology, Inc., Boise, ID (US)

(72) Inventors: Shing-Yih Shih, New Taipei (TW); Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/676,350

(22) Filed: Aug. 14, 2017

(65) Prior Publication Data

US 2017/0365580 A1     Dec. 21, 2017

Related U.S. Application Data

(63) Continuation of application No. 15/135,539, filed on Apr. 21, 2016, now Pat. No. 9,761,559.

(51) Int. Cl.
    *H01L 25/065*      (2006.01)

(52) U.S. Cl.
CPC ............... *H01L 25/0652* (2013.01); *H01L 2225/06513* (2013.01); *H01L 2225/06544* (2013.01); *H01L 2225/06558* (2013.01); *H01L 2225/06586* (2013.01)

(58) Field of Classification Search
CPC ............... H01L 23/49524; H01L 23/60; H01L 23/49562; H01L 23/3107; H01L 23/5384; H01L 23/538
See application file for complete search history.

(56) References Cited

U.S. PATENT DOCUMENTS

| | | | |
|---|---|---|---|
| 9,099,999 B1* | 8/2015 | Wang | H03K 17/00 |
| 9,379,909 B2 | 6/2016 | Lee et al. | |
| 2004/0217485 A1* | 11/2004 | Chung | H01L 21/563 |
| | | | 257/778 |
| 2010/0065955 A1 | 3/2010 | Chye et al. | |
| 2012/0068229 A1 | 3/2012 | Bemanian et al. | |

(Continued)

FOREIGN PATENT DOCUMENTS

| | | |
|---|---|---|
| CN | 103367336 A | 10/2013 |
| CN | 104051412 A | 9/2014 |
| CN | 105428334 A | 3/2016 |

OTHER PUBLICATIONS

Chinese Office Action and Search Report for Chinese Application No. 201610600640.5, dated Mar. 30, 2018, 13 pages with English translation.

*Primary Examiner* — (Vikki) Hoa B Trinh
(74) *Attorney, Agent, or Firm* — TraskBritt

(57) ABSTRACT

A semiconductor package may include a first logic die and a second logic die located laterally adjacent to the first logic die. A bridge memory die may be coupled to both the first logic die and the second logic die on a first active face of the first logic die and a second active face of the second logic die. A redistribution layer (RDL) structure may be coupled to the first logic die, the second logic die, and the bridge memory die. The bridge memory die may be interposed between at least a portion of the first logic die and the RDL structure and between at least a portion of the second logic die and the RDL structure. A molding compound may at least partially encapsulate the first logic die, the second logic die, and the bridge memory die.

18 Claims, 13 Drawing Sheets

(56) References Cited

U.S. PATENT DOCUMENTS

| | | |
|---|---|---|
| 2014/0264832 A1 | 9/2014 | Meyer et al. |
| 2015/0171006 A1 | 6/2015 | Hung et al. |
| 2015/0332994 A1 | 11/2015 | Mallik et al. |
| 2016/0013153 A1 | 1/2016 | Meyer |
| 2016/0133571 A1* | 5/2016 | Lee .................. H01L 21/56 257/774 |
| 2017/0301625 A1* | 10/2017 | Mahajan ............ H01L 23/5381 |

* cited by examiner

SEMICONDUCTOR PACKAGE AND FABRICATION METHOD THEREOF

CROSS-REFERENCE TO RELATED APPLICATION

This application is a continuation of U.S. patent application Ser. No. 15/135,539, filed Apr. 21, 2016, now U.S. Pat. No. 9,761,559, issue Sep. 12, 2017, the disclosure of which is incorporated herein in its entirety by this reference.

TECHNICAL FIELD

The present invention relates to semiconductor packaging. More particularly, the present invention relates to a semiconductor package integrating multiple logic dies and dual-port RAM (random-access memory) in one package.

BACKGROUND

Dual-port RAM is known in the art. Dual-port RAM can read and write different memory cells simultaneously at different addresses. This is the main difference between dual-port RAM and single-port RAM, as single-port RAM can only be accessed at one address at a time. Therefore, single-port RAM allows only one memory cell to be read/write during each clock cycle.

Video RAM, also known as VRAM, is a type of dual-port dynamic RAM (DRAM) that is used for video memory. VRAM allows a computer CPU to draw the image at the same time that the video hardware is reading it out to the screen. Other types of dual-port RAM are based on static RAM (SRAM). Most computer CPUs implement their processor registers as a dual-ported or multi-ported RAM.

FIG. 1 illustrates a prior art memory system 100 comprising a circuit board 101, a dual-port RAM 120 mounted on the circuit board 101, and two processors 140 and 160 mounted on the circuit board 101 on two opposite sides of the dual-port RAM 120. The two processors 140 and 160 are in communication with the dual-port RAM 120 through the memory buses 110 on the circuit board 101. It is desirable in this industry to improve data transfer speed between the processors 140 and 160 and the dual-port RAM 120.

BRIEF SUMMARY

It is one object of the invention to provide an improved semiconductor package and fabrication methods thereof, which are capable of integrating multiple logic dies and dual-port RAM in one package.

In one aspect, the present invention discloses a semiconductor package including a first logic die, a second logic die disposed in close proximity to the first logic die, a bridge memory die coupled to both the first logic die and the second logic die, a redistribution layer (RDL) structure coupled to the first logic die and the second logic die, and a molding compound at least partially encapsulating the first logic die, the second logic, and the bridge memory die.

According to one embodiment, the first logic die and the second logic die are coplanar. The bridge memory die is electrically coupled to the first logic die and the second logic die in a face-to-face configuration.

According to one embodiment, the bridge memory die may be a dual-port RAM. For example, the bridge memory die may be a dual-port DRAM.

According to one embodiment, the first logic die comprises central processing units, graphics processing units, or application processors. The second logic die comprises central processing units, graphics processing units, or application processors.

According to one embodiment, the bridge memory die allows inter-processor communication between the first logic die and the second logic die.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
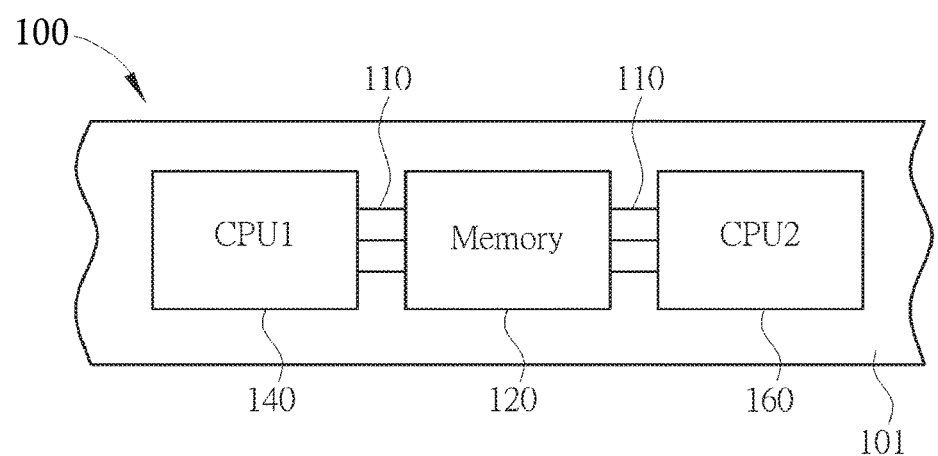
FIG. 1 illustrates a prior art memory system.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale. The terms "die," "chip," "semiconductor chip," and "semiconductor die" may be used interchangeably throughout the specification.

The terms "wafer" and "substrate" used herein include any structure having an exposed surface onto which a layer is deposited according to the present invention, for example, to form a circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

The present invention pertains to a multi-processor semiconductor package that integrates at least two logic dies and a bridge memory die within one discrete package. The bridge memory die may be a dual-port DRAM die and the two logic dies can address the bridge memory die at the same time. Compared with the prior art, the length between the memory die and the logic die is reduced and therefore the memory operating speeds and the signal integrity can both be improved.

Figure 2:
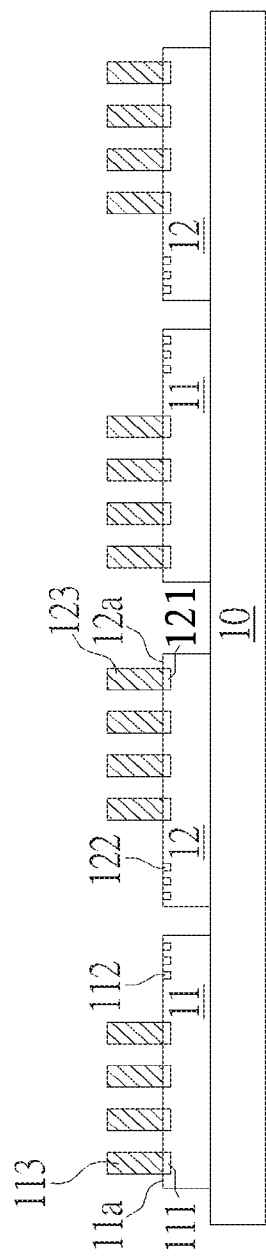
FIG. 2 through FIG. 6 are schematic, cross-sectional diagrams showing an exemplary method of fabricating a semiconductor package in accordance with one embodiment of the invention.

FIG. 2 through FIG. 6 are schematic, cross-sectional diagrams showing an exemplary method of fabricating a semiconductor package in accordance with one embodiment of the invention. As shown in FIG. 2, first, a carrier 10 is provided. The carrier 10 may be a releasable substrate material suitable for supporting a thin substrate. For example, the carrier 10 may comprise silicon, glass, or metal, but is not limited thereto. Logic dies 11 and 12 are attached onto a top surface of the carrier 10 with their active faces 11a and 12a facing upward. The logic die 11 is disposed in close proximity to the logic die 12. The logic die 11 and the logic die 12 are coplanar.

The logic dies 11 and 12 may be, for example, processors such as central processing units (CPUs), graphics processing units (GPUs), or application processors, but is not limited thereto. The two logic dies 11 and 12 may be, for example, a system on a chip ("SoC"), but is not limited thereto.

On the active face 11a of the logic die 11, input/output (I/O) pads 111 and 112 are provided. The I/O pads 112 are disposed near the edge of the logic die 11 that is close to the logic die 12. Connecting elements 113 such as metal bumps or metal pillars are formed on the I/O pads 111, respectively. According to one embodiment, the connecting elements 113 may comprise copper, aluminum, gold, or the like, but is not limited thereto. On the active face 12a of the logic die 12, likewise, I/O pads 121 and 122 are provided. The I/O pads 122 are disposed near the edge of the logic die 12 that is close to the logic die 11. Connecting elements 123 such as metal bumps or metal pillars are formed on the I/O pads 121, respectively. According to one embodiment, the connecting elements 123 may comprise copper, aluminum, gold, or the like, but is not limited thereto.

Figure 3:
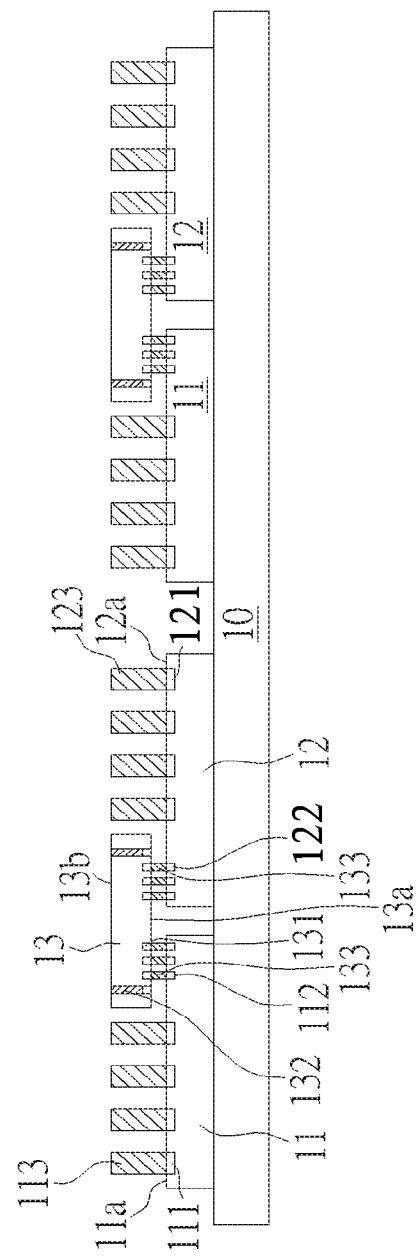

As shown in FIG. 3, a bridge memory die 13 is coupled to the logic dies 11 and 12. The bridge memory die 13 is mounted on the respective I/O pads 112 and 122 via connecting elements 133 such as micro bumps, solder bumps, metal bumps, or metal pillars. According to one embodiment, the bridge memory die 13 may be a flip chip memory die. The active face 13a of the bridge memory die 13 faces downward and is coupled to the two logic dies 11 and 12 in a face-to-face configuration. On the active face 13a of the bridge memory die 13, I/O pads 131 are provided. The inactive face 13b of the bridge memory die 13 (or the top surface of the bridge memory die 13 opposite to the active face 13a in this figure) is substantially flush or coplanar with the top surfaces of the connecting elements 123.

According to one embodiment, the bridge memory die 13 may be a dual-port RAM, such as a dual-port DRAM, but is not limited thereto. According to the embodiment, the bridge memory die 13 allows data to be exchanged between the two logic dies 11 and 12 or allows any inter-processor communication. Dual-port DRAMs provide speed advantages over conventional DRAMs by providing an additional input/output port to the memory array. In conventional DRAMs, read and write operations may never occur simultaneously, as both operations occur through a single random-access port. In a dual-port DRAM, the second port (most often a serial port) is provided in addition to the random-access port. Data is read and written by transferring an entire array row at one time between a serial shift register and the array.

According to one embodiment, through substrate vias (TSVs) 132 may be disposed, for example, along the perimeter of the bridge memory die 13. The TSVs 132 are fabricated by conventional TSV processes and are electrically coupled to at least some of the I/O pads 131. According to one embodiment of the invention, the bridge memory die 13 is electrically coupled to a metal layer 302 of a RDL structure 30 through at least some of the TSVs 132. For example, power or ground signals may be supplied to the bridge memory die 13 through the RDL structure 30 and the TSVs 132.

According to one embodiment of the invention, the bridge memory die 13 may be coupled to both of the logic dies 11 and 12 using, for example, a flip-chip bonding process. By providing such face-to-face configuration, the bridge memory die 13 is disposed in close proximity to the two logic dies 11 and 12. The distance between the memory die and the logic die is reduced and therefore the memory operating speeds and the signal integrity can be improved.

Figure 4:
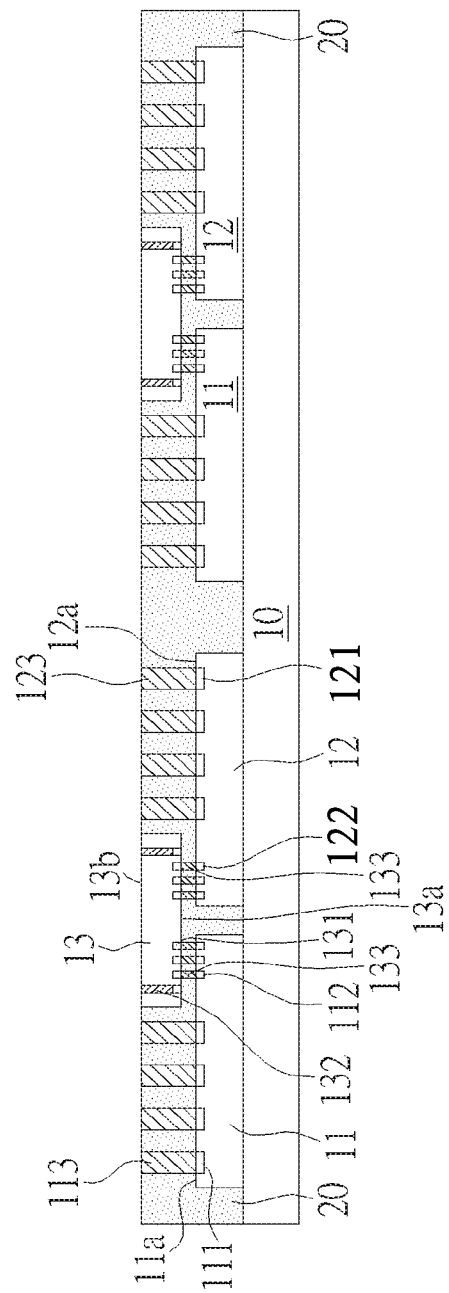

As shown in FIG. 4, a molding compound 20 is applied to at least partially encapsulate the two logic dies 11 and 12, the bridge memory die 13, and the connecting elements 113 and 123. The molding compound 20 may fill into a gap between the bridge memory die 13 and the two logic dies 11 and 12, and into a gap between the two logic dies 11 and 12. According to one embodiment of the invention, the molding compound 20 may be subjected to a curing process.

According to one embodiment of the invention, the molding compound 20 may comprise a mixture of polymer, epoxy and/or silica fillers, but is not limited thereto. According to one embodiment of the invention, the molding compound 20 may be subjected to a grinding process to expose the top surfaces of the TSVs 132 of the bridge memory die 13 and the top surfaces of the connecting elements 113 and 123.

Figure 5:
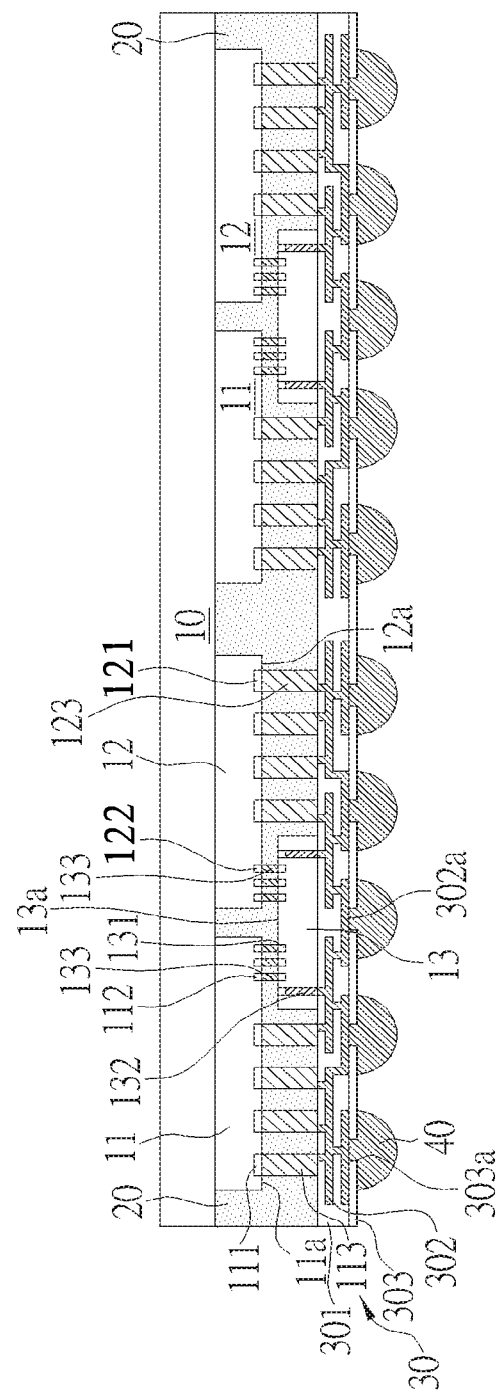

As shown in FIG. 5, a redistribution layer (RDL) structure 30 is formed to couple to the TSVs 132 of the bridge memory die 13 and the top surfaces of the connecting elements 113 and 123. The RDL structure 30 may include, but is not limited to, a dielectric layer 301 and at least one metal layer 302 in the dielectric layer 301. The dielectric layer 301 may comprise organic materials such as polyimide (PI) or inorganic materials such as silicon nitride, silicon oxide or the like, but is not limited thereto. The metal layer 302 may comprise aluminum, copper, tungsten, titanium, titanium nitride, or the like. The RDL structure 30 may be formed using techniques known in the art.

The RDL structure 30 may further comprise a passivation layer or a solder mask 303 covering the lower surface of the RDL structure 30. Solder openings 303a may be formed in the solder mask 303 to expose respective solder pads 302a. Solder bumps (e.g., C4) or solder balls (e.g., BGA balls) 40 are disposed in the respective solder openings 303a and on the lower surface of the RDL structure 30 to form a ball grid array. Although not explicitly shown in this figure, it is understood that an UBM may be formed before disposing the solder balls 40.

Figure 6:
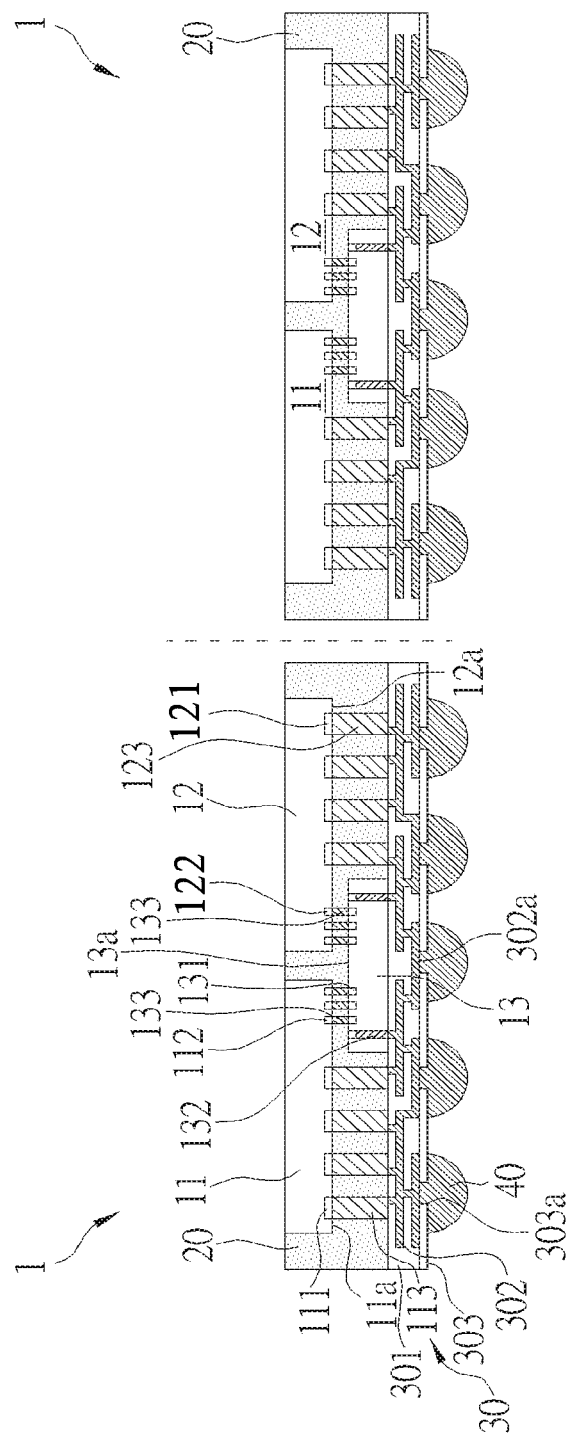

As shown in FIG. 6, after forming the solder bumps or solder balls 40 on the lower surface of the RDL structure 30, the carrier 10 is removed. The de-bonding of the carrier 10 may be performed by using a laser process, UV irradiation process, grinding process, or etching process, but is not limited thereto. The wafer level package is then diced and singulated into individual semiconductor packages 1.

According to the embodiment, the semiconductor package 1 comprises two logic dies 11 and 12 concurrently coupled to one bridge memory die 13. According to the embodiment, the bridge memory die 13 is directly coupled to the RDL structure 30. The inactive surface 13b is in direct contact with the RDL structure 30. According to the embodiment, the bridge memory die 13 is electrically connected to the metal layer 302 of the RDL structure 30 through the TSVs 132. According to the embodiment, the bridge memory die 13 is disposed between the RDL structure 30 and the logic dies 11, 12.

It is advantageous to use the present invention because data or signals may be transferred directly through the connecting elements 133 between the bridge memory die 13 and the logic dies 11 and 12. The bridge memory die 13 may be a dual-port DRAM, which allows inter-processor communication. The logic dies 11 and 12 share the bridge memory die 13 and can address the bridge memory die 13 at the same time in a shorter distance, and therefore the operating speeds can be significantly increased.

Figure 7:
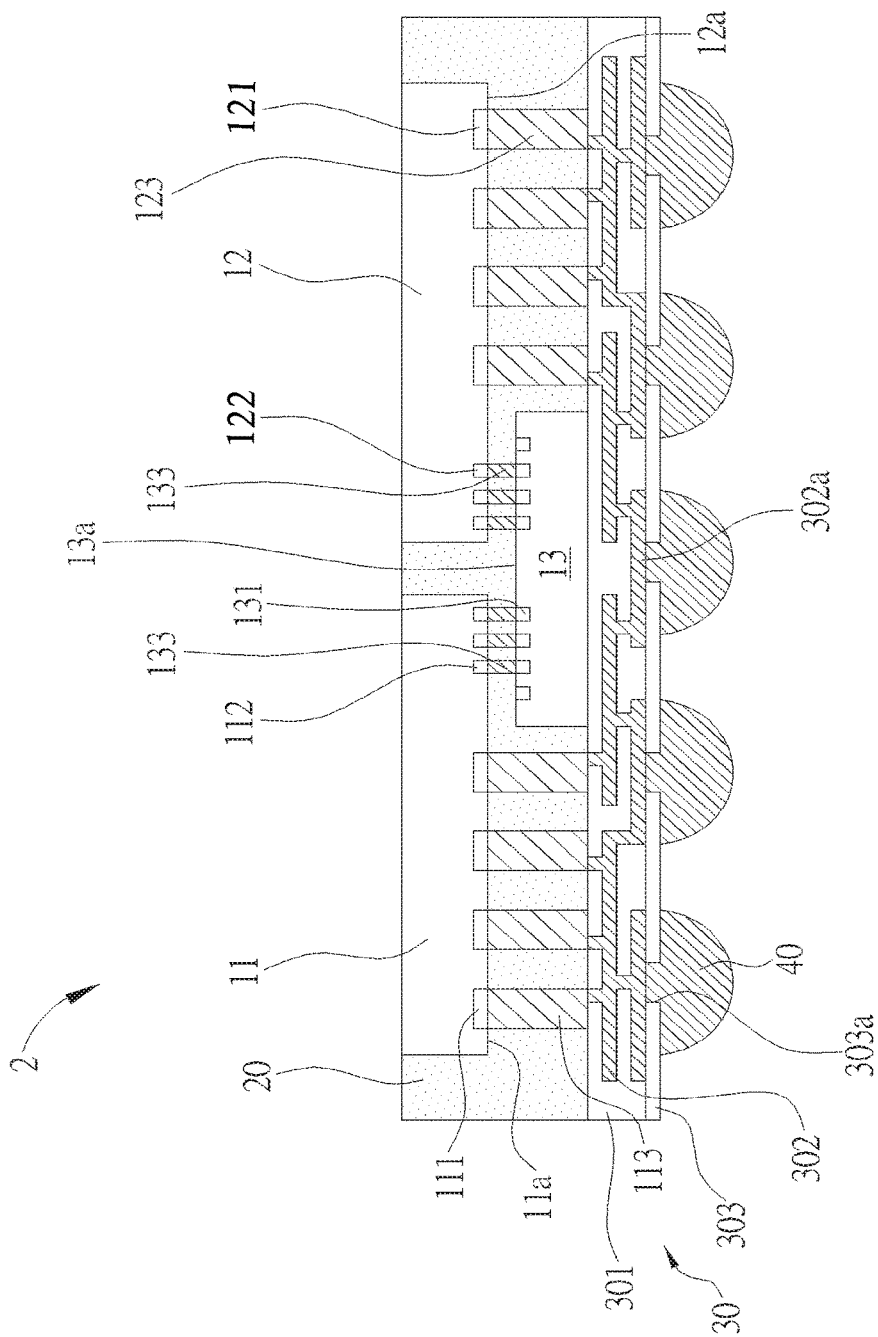
FIG. 7 is a schematic, cross-sectional diagram showing a semiconductor package in accordance with another embodiment of the invention.

FIG. 7 is a schematic, cross-sectional diagram showing a semiconductor package in accordance with another embodiment of the invention, wherein like numeral numbers designate like layers, regions, or elements. As shown in FIG. 7, the semiconductor package 2 is different from the semiconductor package 1 of FIG. 6 in that the bridge memory die 13 of the semiconductor package 2 does not comprise TSVs 132. Therefore, the circuitry in the bridge memory die 13 is not directly coupled to the RDL structure 30.

Figure 8:
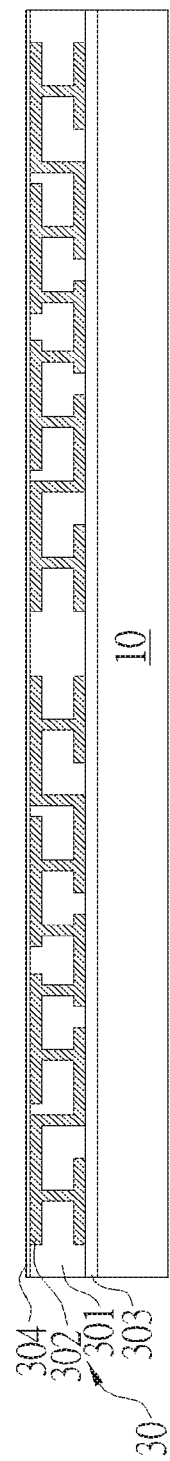
FIG. 8 through FIG. 12 are schematic, cross-sectional diagrams showing an exemplary method of fabricating a semiconductor package in accordance with still another embodiment of the invention.

FIG. 8 through FIG. 12 are schematic, cross-sectional diagrams showing an exemplary method of fabricating a semiconductor package in accordance with still another embodiment of the invention, wherein like numeral numbers designate like layers, regions, or elements. As shown in FIG. 8, a carrier 10 is provided. The carrier 10 may be a releasable substrate material suitable for supporting a thin substrate. For example, the carrier 10 may comprise silicon, glass, or metal, but is not limited thereto.

Subsequently, a redistribution layer (RDL) structure 30 is formed to directly on the carrier 10. The RDL structure 30 may include, but is not limited to, a dielectric layer 301 and at least one metal layer 302 in the dielectric layer 301. The dielectric layer 301 may comprise organic materials such as polyimide (PI) or inorganic materials such as silicon nitride, silicon oxide or the like, but is not limited thereto. The metal layer 302 may comprise aluminum, copper, tungsten, titanium, titanium nitride, or the like. The RDL structure 30 may further comprise a passivation layer or a solder mask 303 covering the lower surface of the RDL structure 30. The RDL structure 30 may further comprise a passivation layer 304 covering the top surface of the RDL structure 30.

Figure 9:
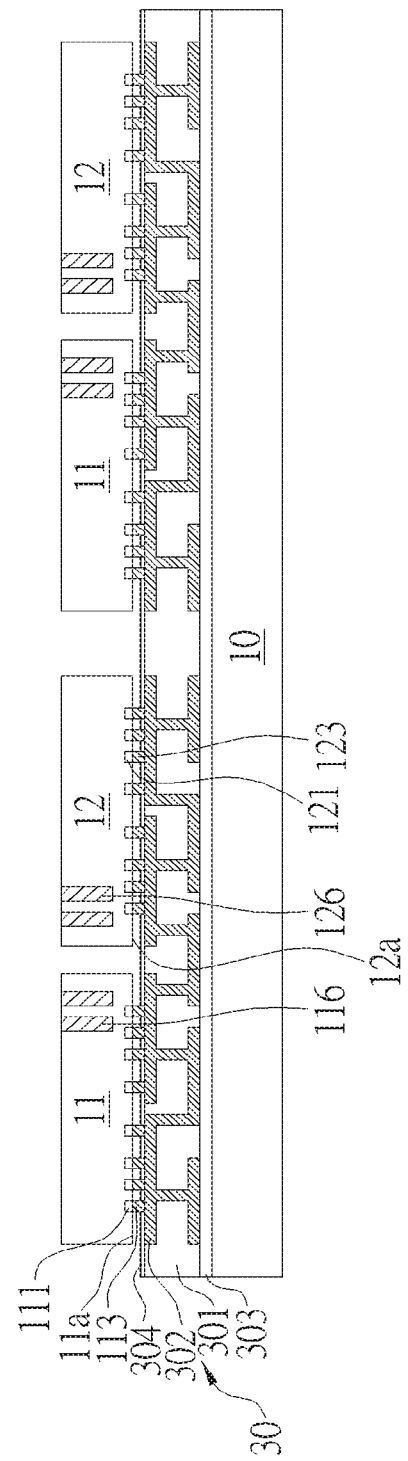

As shown in FIG. 9, logic dies 11 and 12 are directly mounted onto a top surface of the carrier 10 with their active faces 11a and 12a facing downward to the RDL structure 30. The logic die 11 is disposed in close proximity to the logic die 12. The logic die 11 and the logic die 12 are coplanar. According to the embodiment, the logic die 11 and the logic die 12 are flip chips. The logic dies 11 and 12 may be, for example, processors such as central processing units (CPUs), graphics processing units (GPUs), or application processors, but is not limited thereto. The logic dies 11 and 12 may be, for example, a system on a chip ("SoC"), but is not limited thereto. The logic die 11 may have functions different from that of the logic die 12, for example, the logic die 11 may be a CPU and the logic die 12 may be a GPU, but is not limited thereto.

On the active face 11a of the logic die 11, input/output (I/O) pads 111 are provided. Connecting elements 113, such as micro bumps, solder bums, metal bumps, or metal pillars, are formed on the I/O pads 111, respectively. According to one embodiment, the connecting elements 113 may comprise copper, aluminum, gold, or the like, but is not limited thereto. Likewise, on the active face 12a of the logic die 12, I/O pads 121 are provided. Connecting elements 123, such as micro bumps, solder bumps, metal bumps, or metal pillars, are formed on the I/O pads 121, respectively. According to one embodiment, the connecting elements 123 may comprise copper, aluminum, gold, or the like, but is not limited thereto.

The first logic die 11 further comprises a plurality of TSVs 116 disposed at least along the edge of the first logic die 11 that is adjacent to the second logic die 12. At least some of the TSVs 116 are electrically coupled to at least some of the I/O pads 111. The second logic die 12 further comprises a plurality of TSVs 126 disposed at least along the edge of the second logic die 12 that is adjacent to the first logic die 11. At least some of the TSVs 126 are electrically coupled to at least some of the I/O pads 121.

Figure 10:
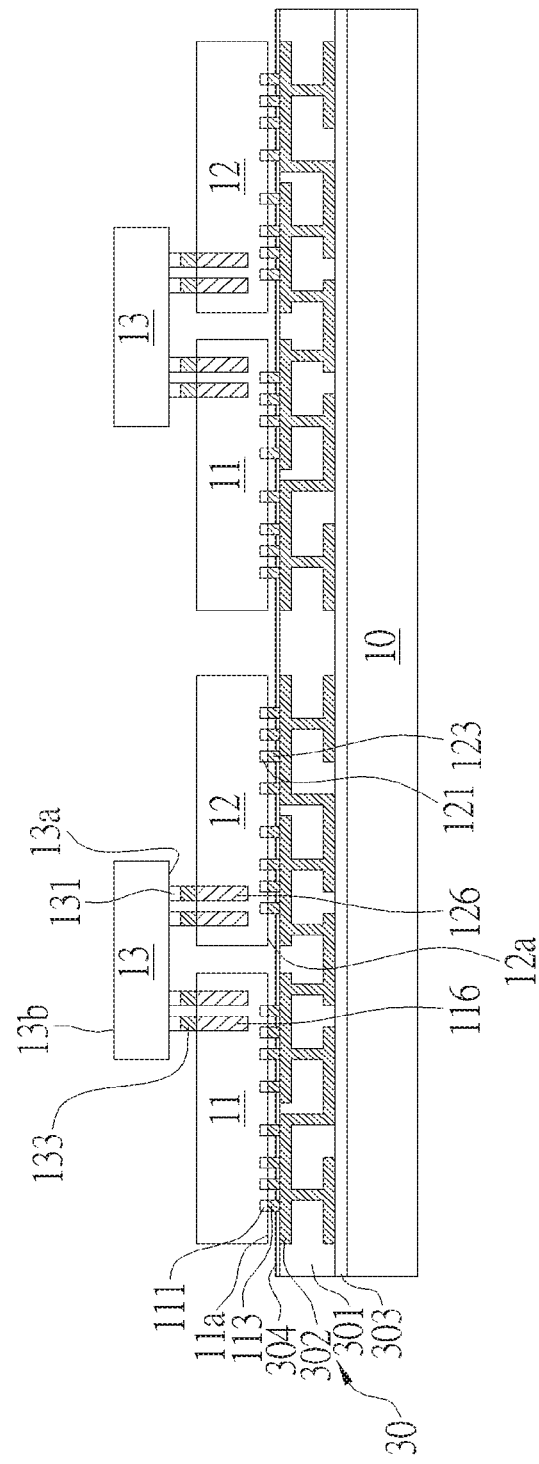

As shown in FIG. 10, a bridge memory die 13 is coupled to the logic dies 11 and 12. The bridge memory die 13 is mounted on the respective TSVs 116 and 126 via connecting elements 133 such as micro bumps, solder bumps, metal bumps, or metal pillars. According to one embodiment, the bridge memory die 13 may be a flip chip memory die. The active face 13a of the bridge memory die 13 faces downward and is coupled to the circuits of the two logic dies 11 and 12 through the TSVs 116 and 126. On the active face 13a of the bridge memory die 13, I/O pads 131 are provided.

According to one embodiment, the bridge memory die 13 may be a dual-port RAM, such as a dual-port DRAM, but is not limited thereto. According to the embodiment, the bridge memory die 13 allows data to be exchanged between the two logic dies 11 and 12 or allows any inter-processor communication. Dual-port DRAMs provide speed advantages over conventional DRAMs by providing an additional input/output port to the memory array. In conventional DRAMs, read and write operations may never occur simultaneously, as both operations occur through a single random-access port. In a dual-port DRAM, the second port (most often a serial port) is provided in addition to the random-access port. Data is read and written by transferring an entire array row at one time between a serial shift register and the array.

Figure 11:
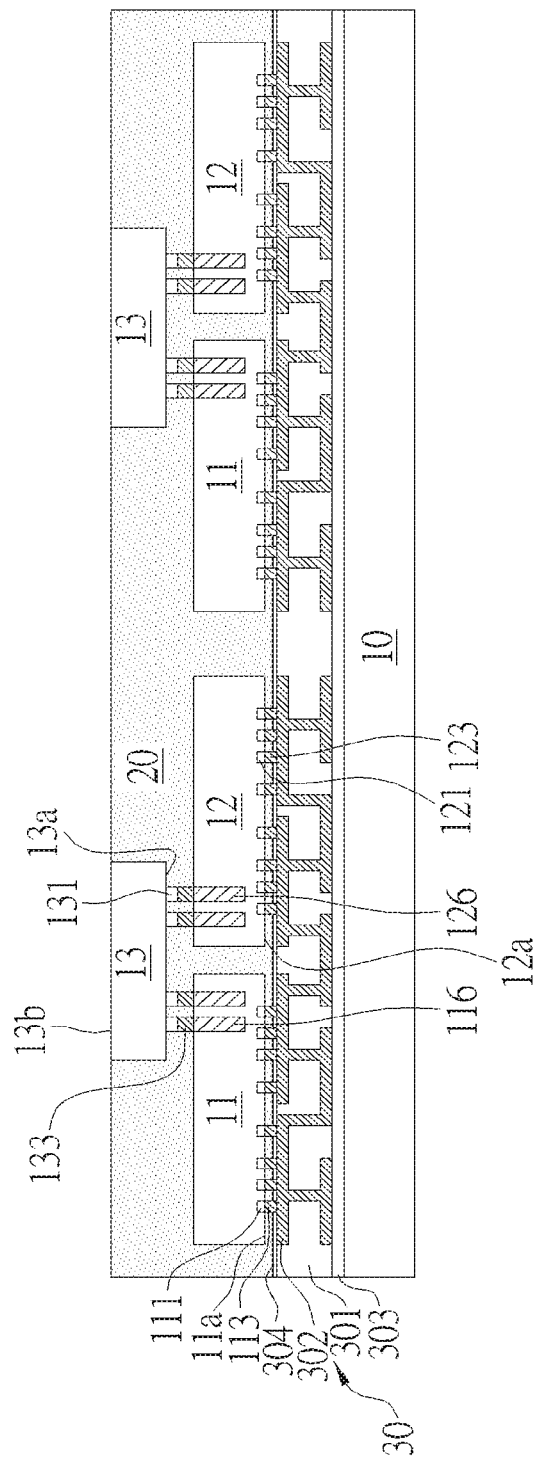

As shown in FIG. 11, a molding compound 20 is applied to at least partially encapsulate the two logic dies 11 and 12, the bridge memory die 13, and the connecting elements 113, 123 and 133. The molding compound 20 may fill into a gap between the bridge memory die 13 and the two logic dies 11 and 12, and into a gap between the two logic dies 11 and 12. According to one embodiment of the invention, the molding compound 20 may be subjected to a curing process. The inactive face 13b of the bridge memory die 13 (or the top surface of the bridge memory die 13 opposite to the active face 13a in this figure) is substantially flush or coplanar with the top surfaces of the molding compound 20.

Figure 12:
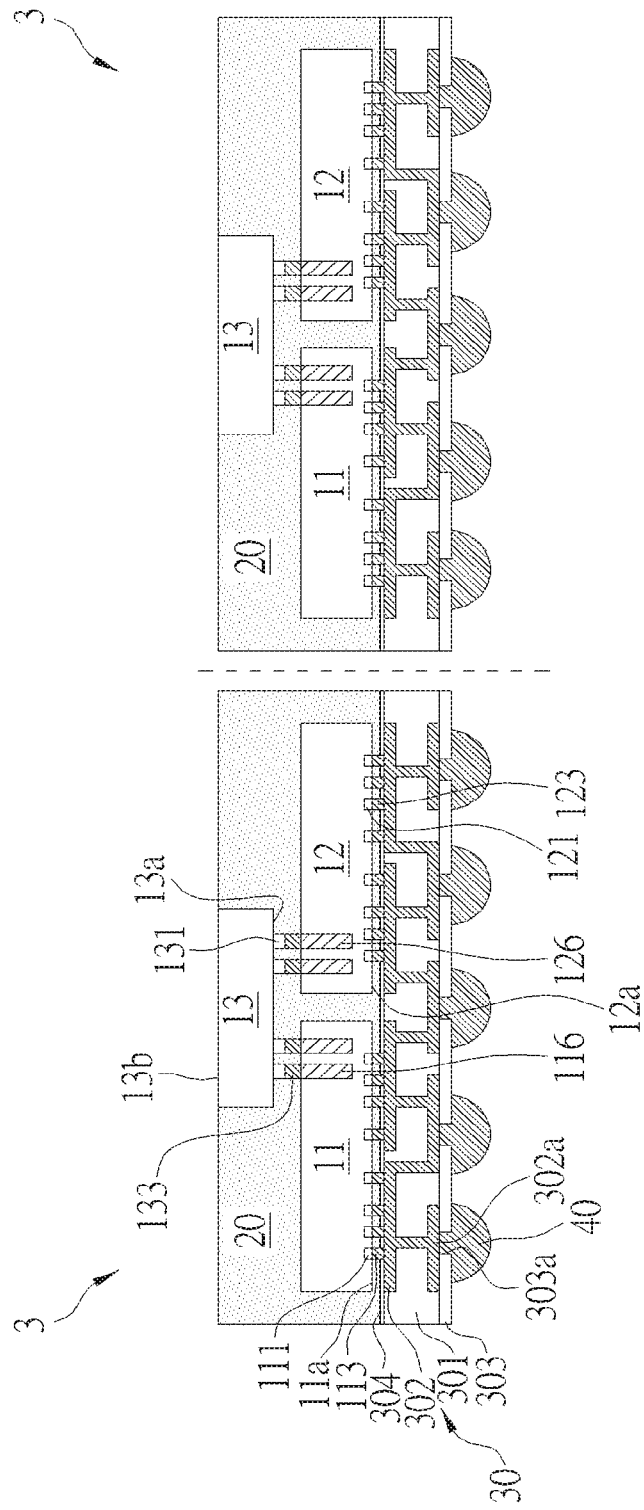

As shown in FIG. 12, after forming the molding compound 20, the carrier 10 is removed. The de-bonding of the carrier 10 may be performed by using a laser process, UV irradiation process, grinding process, or etching process, but is not limited thereto. Subsequently, solder openings 303a may be formed in the solder mask 303 to expose respective solder pads 302a. Solder bumps (e.g., C4) or solder balls (e.g., BGA balls) 40 are disposed in the respective solder openings 303a and on the lower surface of the RDL structure 30 to form a ball grid array. Although not explicitly shown in this figure, it is understood that an UBM may be formed before disposing the solder balls 40. The wafer level package is then diced and singulated into individual semiconductor packages 3.

According to the embodiment, the semiconductor package 3 comprises two logic dies 11 and 12 concurrently coupled to one bridge memory die 13. According to the embodiment, the bridge memory die 13 is not directly coupled to the RDL structure 30. The inactive surface 13b is in direct contact with the RDL structure 30. According to the embodiment, the bridge memory die 13 is electrically connected to the logic dies 11 and 12 through the connecting elements 133 and the TSVs 116 and 126. According to the embodiment, the logic dies 11, 12 are disposed between the RDL structure 30 and the bridge memory die 13.

Figure 13:
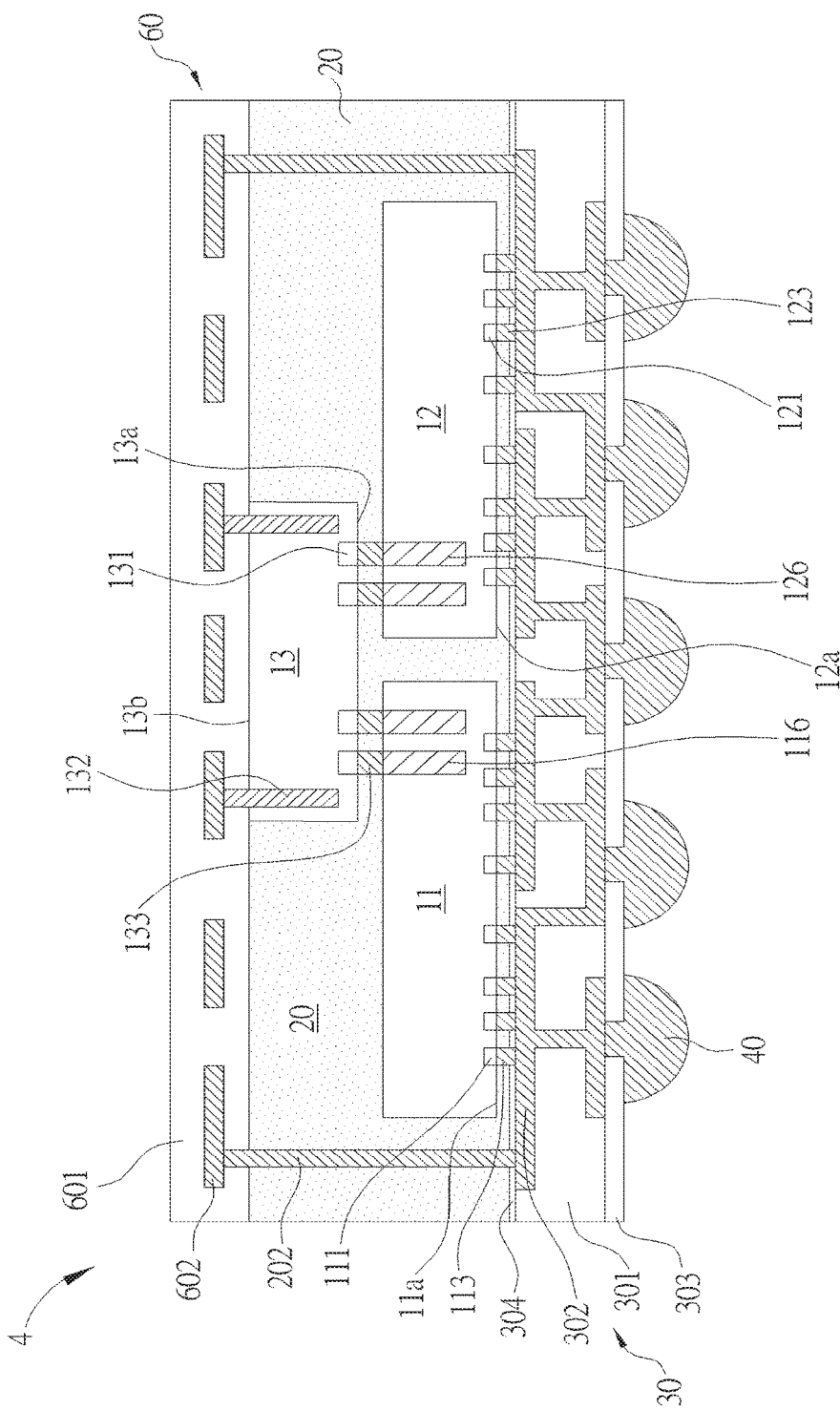
FIG. 13 is a schematic, cross-sectional diagram showing a semiconductor package in accordance with still another embodiment of the invention.

FIG. 13 is a schematic, cross-sectional diagram showing a semiconductor package in accordance with still another embodiment of the invention, wherein like numeral numbers designate like layers, regions, or elements. As shown in FIG. 13, the semiconductor package 4 is different from the semiconductor package 3 of FIG. 12 in that the bridge memory die 13 of the semiconductor package 4 further comprise TSVs 132. The semiconductor package 4 further comprises an upper redistribution layer (RDL) structure 60 directly on the inactive face 13b of the bridge memory die 13 and the top surface of the molding compound 20. The upper RDL structure 60 comprises at least a dielectric layer 601 and at least a metal layer 602 in the dielectric layer 601. The semiconductor package 4 further comprises a through mold via (TMV) 202 that is electrically connected to the metal layer 602 of the upper RDL structure 60. Therefore, the circuity in the bridge memory die 13 is coupled to the RDL structure 30 through the upper RDL structure 60 and the TMV 202.

It is advantageous to use the present invention because data or signals may be transferred directly through the connecting elements 133 between the bridge memory die 13 and the logic dies 11 and 12. The bridge memory die 13 may be a dual-port DRAM, which allows inter-processor communication. The logic dies 11 and 12 share the bridge memory die 13 and can address the bridge memory die 13 at the same time in a shorter distance, and therefore the operating speeds can be significantly increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor package, comprising:
a first logic die;
a second logic die located laterally adjacent to the first logic die, a first active face of the first logic die and a second active face of the second logic die facing a same direction;
a bridge memory die coupled to both the first logic die and the second logic die on the first active face and the second active face;
a redistribution layer (RDL) structure directly, electrically coupled to the first logic die, the second logic die, and the bridge memory die, wherein the bridge memory die is directly coupled to metal layers of the RDL structure by a plurality of through substrate vias extending from proximate the first active face and the second active face, through the bridge memory die, to the RDL structure and the first logic die and the second logic die are directly coupled to the metal layers of the RDL structure by connecting elements extending from the first active face and the connecting elements extending from the second active face, laterally adjacent to the bridge memory die, to the RDL structure, the bridge memory die being interposed between at least a portion of the first logic die and the RDL structure and between at least a portion of the second logic die and the RDL structure; and
a molding compound at least partially encapsulating the first logic die, the second logic die, and the bridge memory die wherein the molding compound comprising at least a through mold via directly connected to the metal of the RDL structure.
2. The semiconductor package of claim 1, wherein the first active face of the first logic die and the second active face of the second logic die are coplanar.
3. The semiconductor package of claim 1, wherein the bridge memory die is electrically coupled to the first logic die and the second logic die in a flip-chip configuration, such that an active face of the bridge memory die faces the first active face and the second active face.
4. The semiconductor package of claim 1, wherein the bridge memory die is a dual-port RAM.
5. The semiconductor package of claim 1, wherein each of the first logic die and the second logic die comprises central processing units, graphics processing units, or application processors.
6. The semiconductor package of claim 1, wherein the bridge memory die enables inter-processor communication between the first logic die and the second logic die.
7. The semiconductor package of claim 1, wherein the at least one through mold via is located laterally adjacent to the bridge memory die.
8. The semiconductor package of claim 1, further comprising a plurality of solder bumps or solder balls mounted on a side of the RDL structure opposite the bridge memory die.
9. The semiconductor package of claim 1, wherein a first inactive face of the first logic die and a second inactive face of the second logic die are exposed and coplanar with a face of the molding compound on a side of the semiconductor package opposite the RDL structure.
10. A method of making a semiconductor package, comprising:
coupling a bridge memory die to first logic die and a second logic die, the bridge memory die located on a first active face of the first logic die and a second active face of the second logic die, the first active face facing a same direction as the second active face;
at least partially encapsulating the first logic die, the second logic die, and the bridge memory die in a molding compound; and
directly, electrically coupling a redistribution layer (RDL) structure to the first logic die, the second logic die, and the bridge memory die, wherein the bridge memory die is directly coupled to metal layers of the RDL structure by a plurality of through substrate vias extending from proximate the first active face and the second active face, through the bridge memory die, to the RDL structure and the first logic die and the second logic die are directly coupled to said metal layers of the RDL structure by connecting elements extending from the first active face and said connecting elements extending from the second active face, laterally adjacent to the bridge memory die, to the RDL structure, the bridge memory die being interposed between at least a portion of the first logic die and the RDL structure and between at least a portion of the second logic die wherein the molding compound comprising at least a through mold via directly connected to metal layers of the RDL structure and the RDL structure.

11. The method of claim 10, wherein coupling the bridge memory die to the first logic die and the second logic die comprises coupling the bridge memory die to the first logic die and the second logic die, the first active face of the first logic die and the second active face of the second logic die being coplanar.

12. The method of claim 10, wherein coupling the bridge memory die to the first logic die and the second logic die comprises coupling the bridge memory die to the first logic die and the second logic die in a flip-chip configuration, such that an active surface of the bridge memory die faces the first active face and the second active face.

13. The method of claim 10, further comprising placing the at least one through mold via on the respective one of the first logic die and the second logic die before coupling the bridge memory die to the first logic die and the second logic die.

14. The method of claim 10, further comprising mounting a plurality of solder bumps or solder balls on a side of the RDL structure opposite the bridge memory die.

15. The method of claim 10, wherein at least partially encapsulating the first logic die, the second logic die, and the bridge memory die in the molding compound comprises leaving a first inactive surface of the first logic die and a second inactive surface of the second logic die exposed and coplanar with a surface of the molding compound on a side of the semiconductor package opposite the RDL structure.

16. The method of claim 10, further comprising temporarily securing the first logic die and the second logic die to a carrier before coupling the bridge memory die to the first logic die and the second logic die.

17. The method of claim 16, further comprising removing the carrier from the first logic die and the second logic die after at least partially encapsulating the first logic die, the second logic die, and the bridge memory die in the molding compound and after coupling the RDL structure to the first logic die, the second logic die, and the bridge memory die.

18. The method of claim 10, further comprising singulating the semiconductor package, including the first logic die, the second logic die, the bridge memory die, the RDL structure, and the molding compound, from at least one other similarly configured semiconductor package.

* * * * *

UNITED STATES PATENT AND TRADEMARK OFFICE
CERTIFICATE OF CORRECTION

Page 1 of 1

PATENT NO. : 10,128,212 B2
APPLICATION NO. : 15/676350
DATED : November 13, 2018
INVENTOR(S) : Shing-Yih Shih and Tieh-Chiang Wu It is certified that error appears in the above-identified patent and that said Letters Patent is hereby corrected as shown below:

On the Title Page
In ITEM (72) Inventors: change "Shing-Yih Shih, New Taipei (TW); Tieh-Chiang Wu, Taoyuan (TW)" to --Shing-Yih Shih, New Taipei City (TW); Tieh-Chiang Wu, Taoyuan City (TW)--

In the Claims

| | | | |
|---|---|---|---|
| Claim 1, | Column 8, | Lines 23,24, | change "compound comprising" to --compound comprises-- |
| Claim 1, | Column 8, | Line 25, | change "metal of the" to --metal layers of the-- |
| Claim 10, | Column 9, | Line 14, | change "compound comprising at" to --compound comprises at-- |

Signed and Sealed this
First Day of January, 2019

Andrei Iancu
*Director of the United States Patent and Trademark Office*